(12) United States Patent
Chiu et al.

(10) Patent No.: US 6,929,980 B2
(45) Date of Patent: Aug. 16, 2005

(54) MANUFACTURING METHOD OF FLIP CHIP PACKAGE

(75) Inventors: Chi-Hao Chiu, Pingtung (TW); Yu-Wen Chen, Kaohsiung (TW); Chi-Ta Chuang, Kaohsiung (TW); Chi-Sheng Chao, Yongkang (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 10/874,273

(22) Filed: Jun. 24, 2004

(65) Prior Publication Data

US 2004/0266061 A1 Dec. 30, 2004

(30) Foreign Application Priority Data

Jun. 30, 2003 (TW) ........................................ 92117866 A

(51) Int. Cl.⁷ .............................................. H01L 21/44
(52) U.S. Cl. ..................................................... 438/108
(58) Field of Search ................................ 438/612, 584, 438/458, 126, 122, 108, 106, 613, 107; 257/787, 783, 778, 699, 680, 738, 737, 687

(56) References Cited

U.S. PATENT DOCUMENTS

2002/0142514 A1 * 10/2002 Scheifers et al. ........... 438/107
2003/0059978 A1 * 3/2003 Suzuki et al. ............... 438/106
2003/0141582 A1 * 7/2003 Yang et al. .................. 257/686

* cited by examiner

Primary Examiner—Craig A. Thompson
Assistant Examiner—Monica D. Harrison
(74) Attorney, Agent, or Firm—Bacon & Thomas

(57) ABSTRACT

A manufacturing method of a flip chip package mainly comprises the following steps. Initially, a chip having an active surface with a plurality of bumps formed thereon is provided. Next, the active surface of the chip is faced to and disposed on an upper surface of a substrate. In such manner, the chip will be electrically connected to the substrate and a gap between the chip and the substrate will be formed. Afterwards, an underfill is filled in the gap and then a first curing process is performed to have the underfill partially hardened to have the underfill transformed into a partially hardened underfill. Finally, the combination of the chip, the substrate and the partially hardened underfill is flipped over to have the substrate located above the chip, then a second curing process is performed to have the partially hardened underfill into a fully hardened underfill, and then flipping over the combination of the chip, the substrate and the fully hardened underfill.

11 Claims, 3 Drawing Sheets

MANUFACTURING METHOD OF FLIP CHIP PACKAGE

BACKGROUND OF THE INVENTION

1. Field of Invention

This invention relates to a manufacturing method of a flip chip package. More particularly, the present invention is related to a manufacturing method of flip chip package regarding to a flip chip package process for ensuring the filler provided in the underfill well and equally distributed after performing curing process.

2. Related Art

In this information explosion age, integrated circuits products are used almost everywhere in our daily life. As fabricating technique continue to improve, electronic products having powerful functions, personalized performance and a higher degree of complexity are produced. Nowadays, most electronic products are relatively light and have a compact body. Hence, in semiconductor production, various types of high-density semiconductor packages have been developed. Flip chip is one of the most commonly used techniques for forming an integrated circuit package. Moreover, compared with a wire-bonding package or a tape automated bonding (TAB) package, a flip-chip package has a shorter electrical path on average and has a better overall electrical performance. In a flip-chip package, the bonding pads on a chip and the contacts on a substrate are connected together through a plurality of bumps. Accordingly, the technology of flip-chip bonding process becomes more and more important in the advanced packaging fields.

As mentioned above, flip chip packaging technology is performed by providing a chip with bonding pads disposed on the active surface and arranged in an area array, forming bumps on the bonding pads, flipping the chip to mount the bumps to the substrate so as to electrically and mechanically connect the chip and the substrate. Next, an underfill is filled in the gap between the substrate and the chip. Afterwards, a curing process is performed to harden the underfill to form a buffer layer between the chip and the substrate. In such a manner, the buffer layer will prevent from the warpage of the substrate and the crack of the chip due to the difference in coefficient of thermal expansion between the substrate and the chip.

Referring to FIG. 1, it illustrates an enlarged cross-sectional view of the manufacturing method of a conventional flip chip package. Therein, as shown in FIG. 1, a chip 100 is provided, wherein the chip 100 has an active surface 101 and a plurality of bonding pads 102 and bumps 104 formed on the bonding pads 102. Next, the chip 100 is flipped to mount to the upper surface 202 of the substrate 200 through the bumps 104 in a flip-chip connection fashion.

Then, referring to FIG. 2, a process of filling the underfill 400 in the gap 300 between the chip 100 and the substrate 200 is performed. Generally speaking, the underfill 400 comprises epoxy and fillers, wherein the epoxy is made of hardening, resin, colorant and promoter and the fillers, with a weight percent ranged from about 70% to 80%, are made of the silicon powder. The silicon powder is utilized to lower the coefficient of the thermal expansion of the underfill and keeps the rigidity of the underfill. Accordingly, when the silicon powder is equally and well distributed in the underfill, the attachment of the substrate 200 to the chip 100 will be upgraded and the reliability of the assembly package will be enhanced.

As mentioned above, when the underfill 400 is filled in the gap 300 between the chip 100 and the substrate 200 and a curing process is performed to harden the underfill 400, the fillers with a larger size will be distributed and located close to the substrate 200 and the fillers with a smaller will be located close to the chip 100 and disposed above the larger fillers due to the gravity effect. Accordingly, the fillers are not well and equally distributed. Thus, the reliability of the assembly package will be declined.

Therefore, providing another manufacturing method of flip chip package to solve the mentioned-above disadvantages is the most important task in this invention.

SUMMARY OF THE INVENTION

In view of the above-mentioned problems, this invention is to provide a manufacturing method of flip chip package regarding to a flip chip package process for ensuring the fillers distributed well and equally in the underfill, after curing process, in order to enhance the reliability of the assembly package.

To achieve the above-mentioned, a manufacturing method of a flip chip package is provided, wherein the manufacturing method mainly comprises providing a chip having a plurality of bumps disposed on the active surface of the chip, providing a substrate, mounting the chip to the substrate through the bumps to have the substrate disposed below the chip and form a gap between the chip and the substrate, filling an underfill in the gap, partially hardening the underfill to have the underfill transformed into a partially hardened underfill, flipping the combination of the substrate and the chip to have the active surface of the chip faced upward and the upper surface of the substrate faced downward, fully hardening the partially hardened underfill to transform the partially hardened underfill into a fully hardened underfill, and flipping the combination of the chip, the substrate and the fully hardened underfill to have the substrate disposed below the chip.

In summary, as specified above, partially hardening the underfill, such as performing a first curing process or disposed the underfill in a stable equilibrium, and then flipping the combination of the chip and the substrate to continue to perform fully hardening the partially hardened underfill, such as performing a second curing process, will cause the filler provided in the underfill distributed well and equally to enhance the reliability of the assembly package. To be noted, usually, the partially hardening process is performed for about two minutes and the fully hardening process is performed for about forty minutes.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

The manufacturing method of a flip chip package according to the preferred embodiment of this invention will be described herein below with reference to the accompanying drawings, wherein the same reference numbers refer to the same elements.

Figure 1:
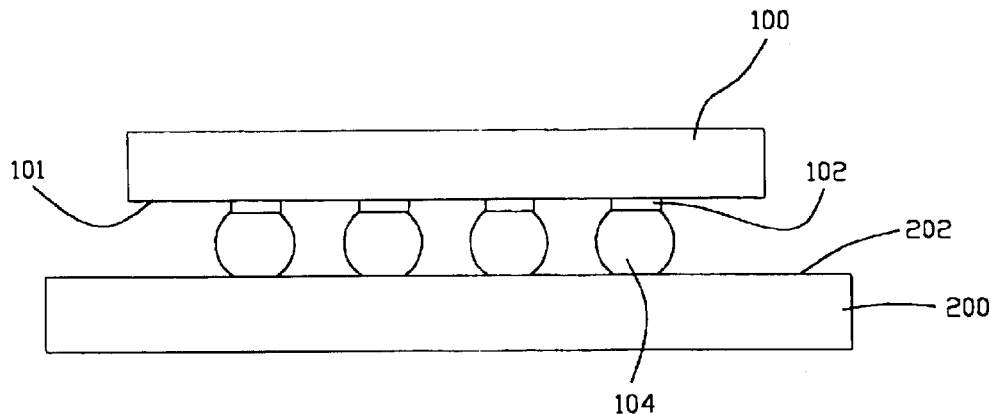
FIG. 1 and FIG. 2 are partially enlarged cross-sectional views showing the progression of steps for manufacturing a flip chip package according to the conventional manufacturing method.
Figure 2:
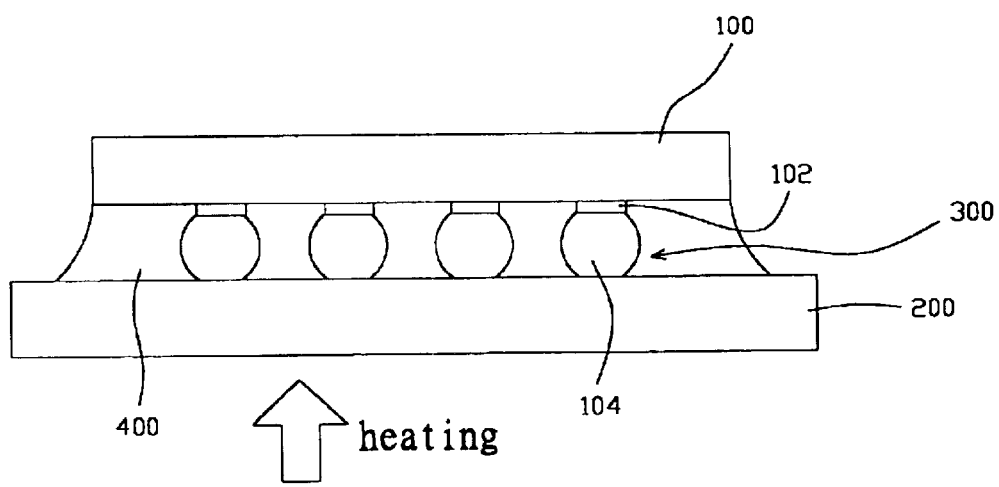
Figure 3:
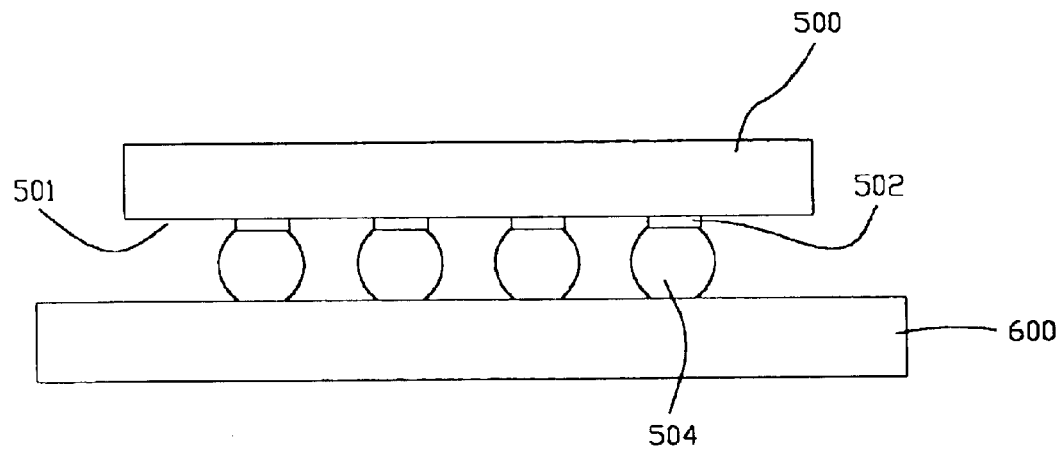
FIGS. 3 to 6 are partially enlarged cross-sectional views showing the progression of steps for manufacturing a flip chip package according to the preferred embodiment of this invention.
Figure 4:
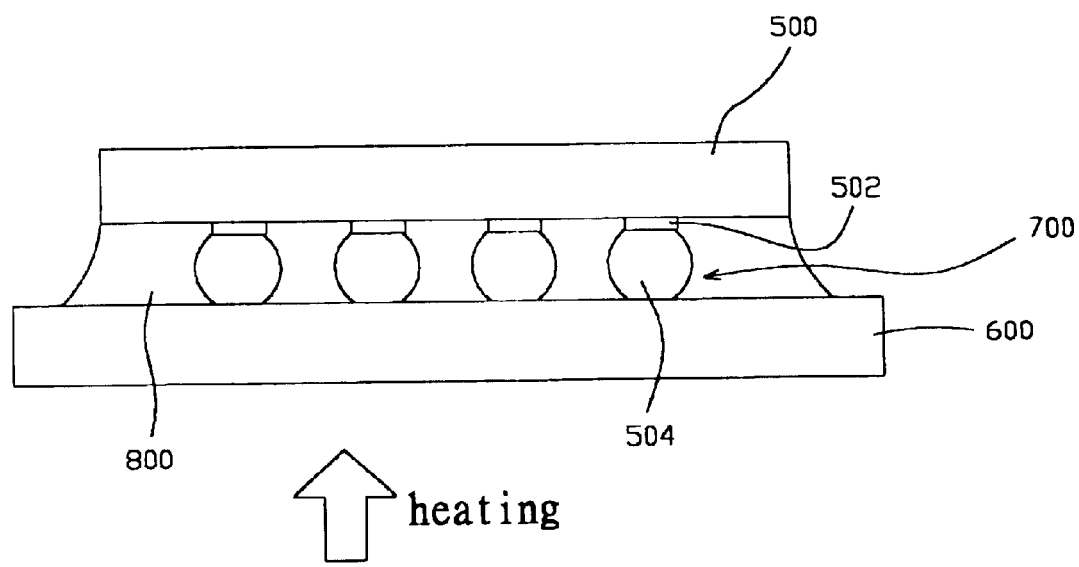
Figure 5:
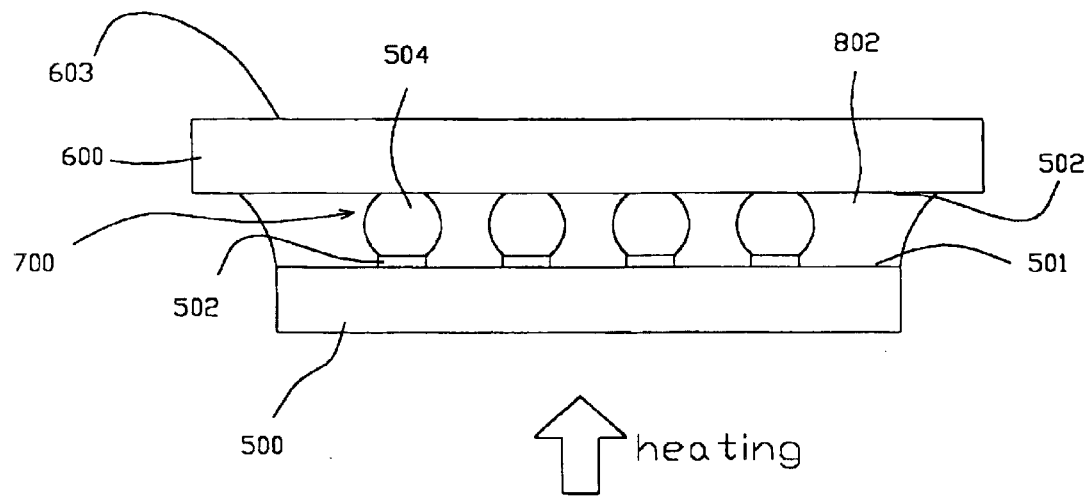
Figure 6:
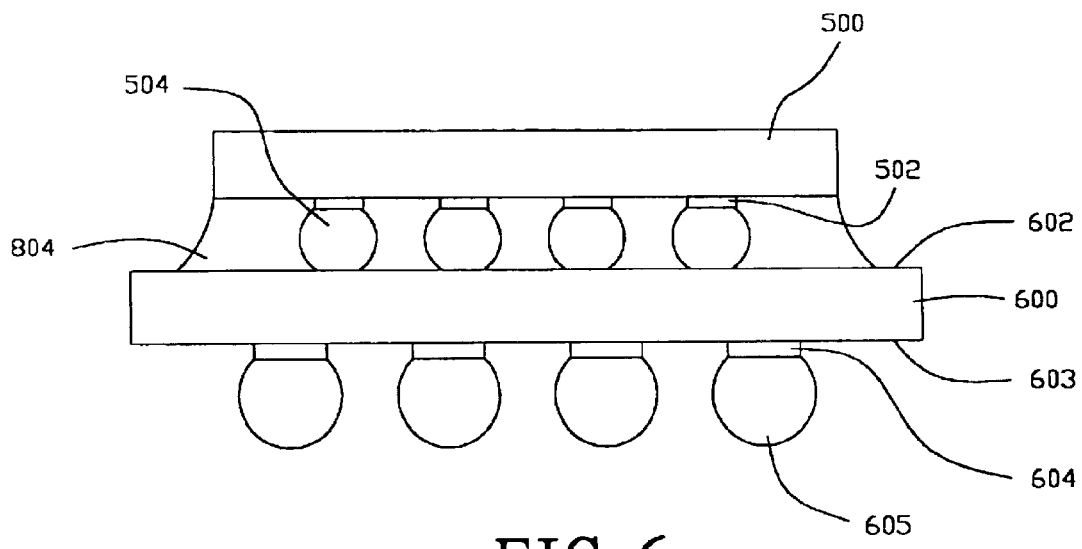

Referring to from FIG. 3 to FIG. 6, which show partially enlarged cross-sectional views showing the progression of steps for manufacturing a flip chip package according to the preferred manufacturing method. Firstly, referring to FIG. 3, there is provided a chip 500 having a plurality of bonding pads 502 and a plurality of bumps 504 attached onto the bonding pads 502. Next, a substrate 600 is provided and mounted to the chip 500 through the bumps 502 so as to have the substrate 600 disposed below the chip 500 and form a gap 700 between the chip 500 and the substrate 600. Then, an underfill filling process is performed to have the gap 700 filled with the underfill 800 as shown in FIG. 4. Afterwards, the process of partially hardening the underfill 800 is performed to have the underfill 800 transformed into a partially hardened underfill. Therein, the process of partially hardening the underfill 800 may comprise a curing process which is performed by placing the semi-finished combination of the chip 500 and the substrate 600 in an oven and then heating the semi-finished combination for about not more than 2 minutes. In addition, the process of partially hardening the underfill 800 maybe performed by placing the semi-finished combination in a stable fashion without any vibration. Here at, the larger fillers in the partially hardened underfill 802 will be disposed at the bottom of the partially hardened underfill 802, namely, close to the substrate 600 and the smaller fillers in the partially hardened underfill 802 will be disposed at the top of the partially hardened underfill 802, namely, adjacent to the chip 500. Next, flipping the combination of the chip 500, the substrate 600 and the partially hardened underfill 802 and then fully hardening the partially hardened underfill 802 as shown in FIG. 5 are performed to have the chip 500 disposed below the substrate 600 and cause the larger fillers in the partially hardened underfill 802 rearranged. Namely, the fillers provided in the partially hardened underfill 802 will be rearrange to form a fully hardened underfill. Therein, the process of fully hardening the partially hardened underfill 802 to transform the partially hardened underfill 802 into a fully hardened underfill 804 may comprise another curing process which is performed by placing the semi-finished combination of the chip 500, the substrate 600 and the partially hardened underfill 802 in another oven and then heating the semi-finished combination for about no more than 40 minutes. Then, the process of flipping the combination of the chip 500, the substrate 600 and the fully hardened underfill 804, and placing solder balls 605 on the solder pads 604 are performed to complete the manufacturing method of the flip chip package as shown in FIG. 6.

As shown above, in the preferred embodiment, partially hardening the underfill, such performing a first curing process or disposed the underfill in a stable equilibrium, and then flipping the combination of the chip and the substrate to continue to perform fully hardening the partially hardened underfill, such as performing a second curing process, will cause the fillers provided in the underfill well and equally distributed to enhance the reliability of the assembly package.

Although the invention has been described in considerable detail with reference to certain preferred embodiments, it will be appreciated and understood that various changes and modifications may be made without departing from the spirit and scope of the invention as defined in the appended claims.

What is claimed is:

1. A manufacturing method of a flip chip package, comprising:

providing a chip having a plurality of bumps disposed on the active surface of the chip;

mounting a substrate to the chip through the bumps to form a gap between the active surface of the chip and an upper surface of the substrate and have the chip disposed above the substrate;

filling an underfill in the gap;

partially hardening the underfill to form a partially hardened underfill;

flipping a first combination of the substrate, the partially hardened underfill and the chip to have the active surface of the chip faced upward and the upper surface of the substrate faced downward;

fully hardening the partially hardened underfill to have the partially hardened underfill transformed into a fully hardened underfill; and flipping a second combination of the chip, the substrate and the fully hardened underfill to have the substrate disposed below the chip.

2. The manufacturing method of claim 1, wherein the step of partially hardening the underfill mainly comprises performing a first curing process.

3. The manufacturing method of claim 2, wherein the first curing process is performed for about less than 2 minutes.

4. The manufacturing method of claim 2, wherein the first curing process is performed for about 2 minutes.

5. The manufacturing method of claim 1, wherein the step of fully hardening the partially hardened underfill mainly comprises performing a second curing process.

6. The manufacturing method of claim 5, wherein the second curing process is performed for about less than 40 minutes.

7. The manufacturing method of claim 5, wherein the second curing process is performed for about 40 minutes.

8. The manufacturing method of claim 1, wherein the step of partially hardening the underfill mainly comprises placing a combination of the chip, the substrate and the underfill in a stable equilibrium.

9. The manufacturing method of claim 1, further comprising the step of disposing solder balls onto a lower surface of the substrate.

10. The manufacturing method of claim 1, wherein the underfill comprises fillers and epoxy.

11. The manufacturing method of claim 10, wherein the filler is made of silicon powder.

* * * * *